US011038495B1

(12) United States Patent
Mei et al.

(10) Patent No.: US 11,038,495 B1
(45) Date of Patent: Jun. 15, 2021

(54) LOW VOLTAGE LEVEL SHIFTER FOR INTEGRATED CIRCUIT

(71) Applicant: Silicon Storage Technology, Inc., San Jose, CA (US)

(72) Inventors: Ryan Mei, Shanghai (CN); Xiaozhou Qian, Shanghai (CN); Hieu Van Tran, San Jose, CA (US); Claire Zhu, Shanghai (CN)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/838,847

(22) Filed: Apr. 2, 2020

(30) Foreign Application Priority Data

Nov. 28, 2019 (CN) .......................... 201911192206.8

(51) Int. Cl.
  *H03K 3/356* (2006.01)
  *H03K 19/185* (2006.01)
  *H03K 19/003* (2006.01)
  *H03K 19/0185* (2006.01)

(52) U.S. Cl.
  CPC . *H03K 3/356113* (2013.01); *H03K 19/00384* (2013.01); *H03K 19/018521* (2013.01); *H03K 19/185* (2013.01)

(58) Field of Classification Search
  CPC ..... H03K 3/356113; H03K 19/018521; H03K 19/00384; H03K 19/185
  See application file for complete search history.

(56) References Cited

U.S. PATENT DOCUMENTS

| 8,629,692 | B1 * | 1/2014 | Ubaradka | ........ H03K 3/356104 326/81 |
| 8,847,761 | B1 | 9/2014 | Choung | |
| 9,780,790 | B2 | 10/2017 | Potluri | |
| 2005/0285658 | A1 | 12/2005 | Schulmeyer | |
| 2006/0290404 | A1 * | 12/2006 | Law | ........ H03K 3/012 327/333 |
| 2007/0018710 | A1 * | 1/2007 | Choi | ........ H03K 3/356113 327/333 |
| 2011/0181338 | A1 | 7/2011 | Olson | |
| 2020/0244252 | A1 * | 7/2020 | Kim | ........ G09G 3/3208 |

FOREIGN PATENT DOCUMENTS

| TW | 201806319 A | 2/2018 |
| TW | 201838338 A | 10/2018 |

OTHER PUBLICATIONS

U.S. Appl. No. 16/732,047, filed Dec. 31, 2019 entitled "Level Shifter for Integrated Circuit," Mei, et al.

* cited by examiner

*Primary Examiner* — Daniel D Chang
(74) *Attorney, Agent, or Firm* — DLA Piper LLP US (57) ABSTRACT

An improved level shifter is disclosed. The level shifter is able to achieve a switching time below 1 ns using a relatively low voltage for VDDL, such as 0.75 V. The improved level shifter comprises a coupling stage and a level-switching stage. A related method of level shifting is also disclosed.

8 Claims, 11 Drawing Sheets

AA and AA-BAR switch between VDDL and 2*VDDL in complementary fashion.

Level Shifting Method
1100

LOW VOLTAGE LEVEL SHIFTER FOR INTEGRATED CIRCUIT

PRIORITY CLAIM

This application claims priority to Chinese Patent Application No. 201911192206.8, filed on Nov. 28, 2019, and titled, "Low Voltage Level Shifter For Integrated Circuit," which is incorporated by reference herein.

FIELD OF THE INVENTION

An improved level shifter capable of operating at high speeds and a low operating voltage is disclosed.

BACKGROUND OF THE INVENTION

Level shifters are important components in integrated circuits. Level shifters convert digital signals from a first voltage domain into a second voltage domain, which is an essential function when different portions of an integrated circuit operate within different voltage domains.

Figure 1:
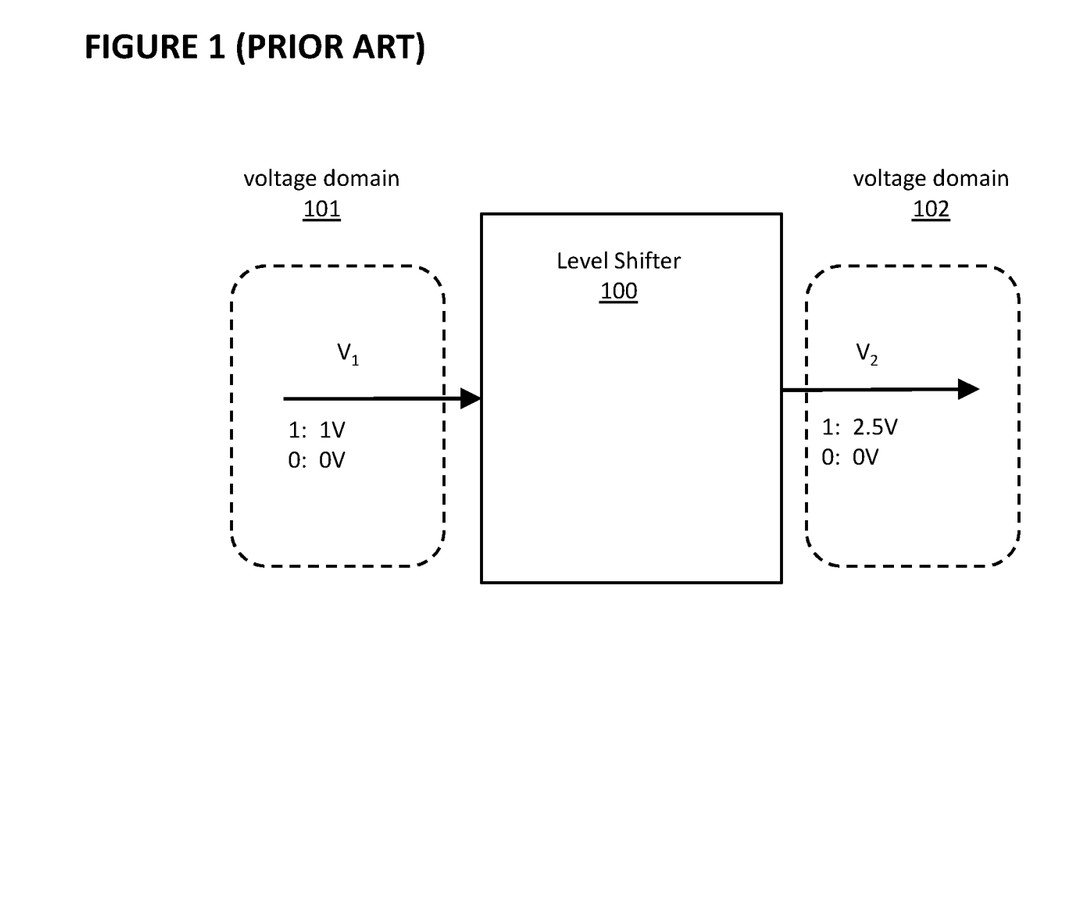
FIG. 1 depicts a prior art level shifter.

FIG. 1 depicts the conceptual operation of level shifter 100, including level shifters known in the prior art. In this example, in voltage domain 101 ($V_1$), a "1" is represented by 1V and a "0" by 0V, and in voltage domain 102 ($V_2$), a "1" is represented by 2.5V and a "0" by 0V. Level shifter 100 converts a "1" from voltage domain 101 (1V) into a "1" in voltage domain 102 (2.5V) and converts a "0" from voltage domain 101 (0V) into a "0" in voltage domain 102 (0V). Other voltage domains that utilize other voltages to represent a "1" and a "0" are known, and one of ordinary skill in the art will appreciate that the voltage values provided in FIG. 1 and herein are mere examples.

Figure 2:
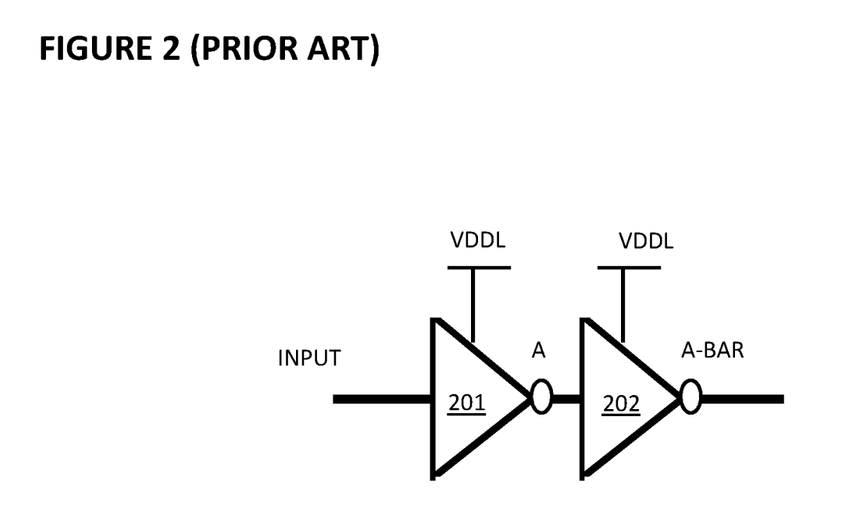
FIG. 2 depicts a prior art set of inverters.

Embodiments of level shifter 100 will now be described with reference to FIGS. 2-4. First, FIG. 2 depicts inverters 201 and 202, where inverter 201 receives INPUT as a signal and produces A as an output (which is the complement of INPUT), and inverter 202 receives A as an input and produces A-BAR as an output (which is the complement of A and is logically the same as INPUT). Here, a "1" value for A and A-BAR, respectively, will have voltage VDDL, which can be, for example, 1V. VDDL may be a low voltage core power supply voltage.

Figure 3:
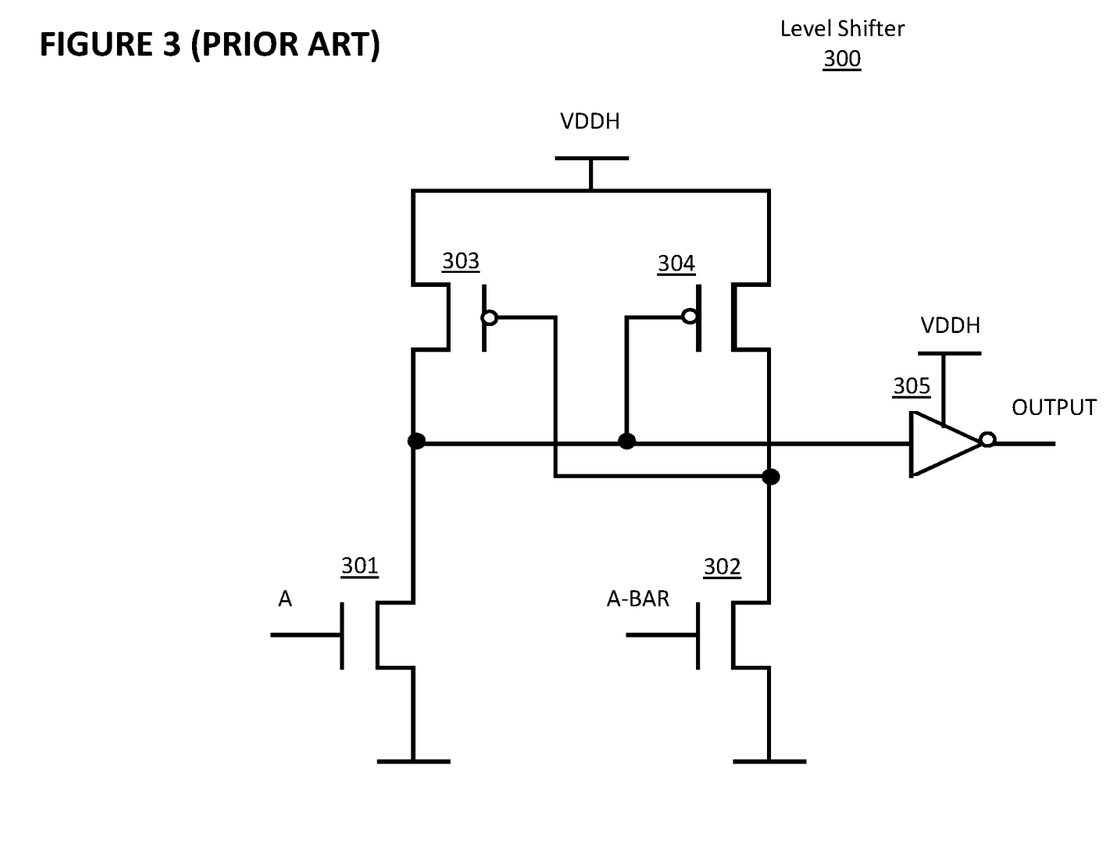
FIG. 3 depicts a prior art level shifter.

FIG. 3 depicts prior art level shifter 300, which is an example of level shifter 100. Level shifter 300 comprises NMOS transistors 301 and 302, PMOS transistors 303 and 304, and inverter 305. Signal A from FIG. 2 is provided to the gate of NMOS transistor 301, and signal A-BAR from FIG. 2 is provided to the gate of NMOS transistor 302.

When A is high, NMOS transistor 301 will be on and transistor 302 will be off. The input to inverter 305 will be pulled to ground through NMOS transistor 301, which also will turn on the gate to PMOS transistor 304. The output of inverter 305, labeled OUTPUT, will be high, which here will be a voltage VDDH, which can be, for example, 2.5V. VDDH may be a high voltage core power supply voltage.

When A is low, NMOS transistor 301 will be off and NMOS transistor 302 will be on. PMOS transistor 303 will be on, since its gate will be pulled to ground through NMOS transistor 302, which will cause the input to inverter 305 to be pulled high through PMOS transistor 303. OUTPUT will then be low.

Prior art level shifter 300 has a significant limitation. Specifically, level shifter 300 cannot operate at switching times less than around 0.5 ns. In the worst case, the switching time can be as high as 1 ns or more. This is due to the inherent variability in the current driving capability of each transistor. In addition, level shifter 300 can fail altogether if the peak voltage of A and A-BAR is too low, i.e. insufficient to fully turn on NMOS transistors 301, 302, respectively, due to low supply voltage VDDL in FIG. 2 being too low.

Figure 4:
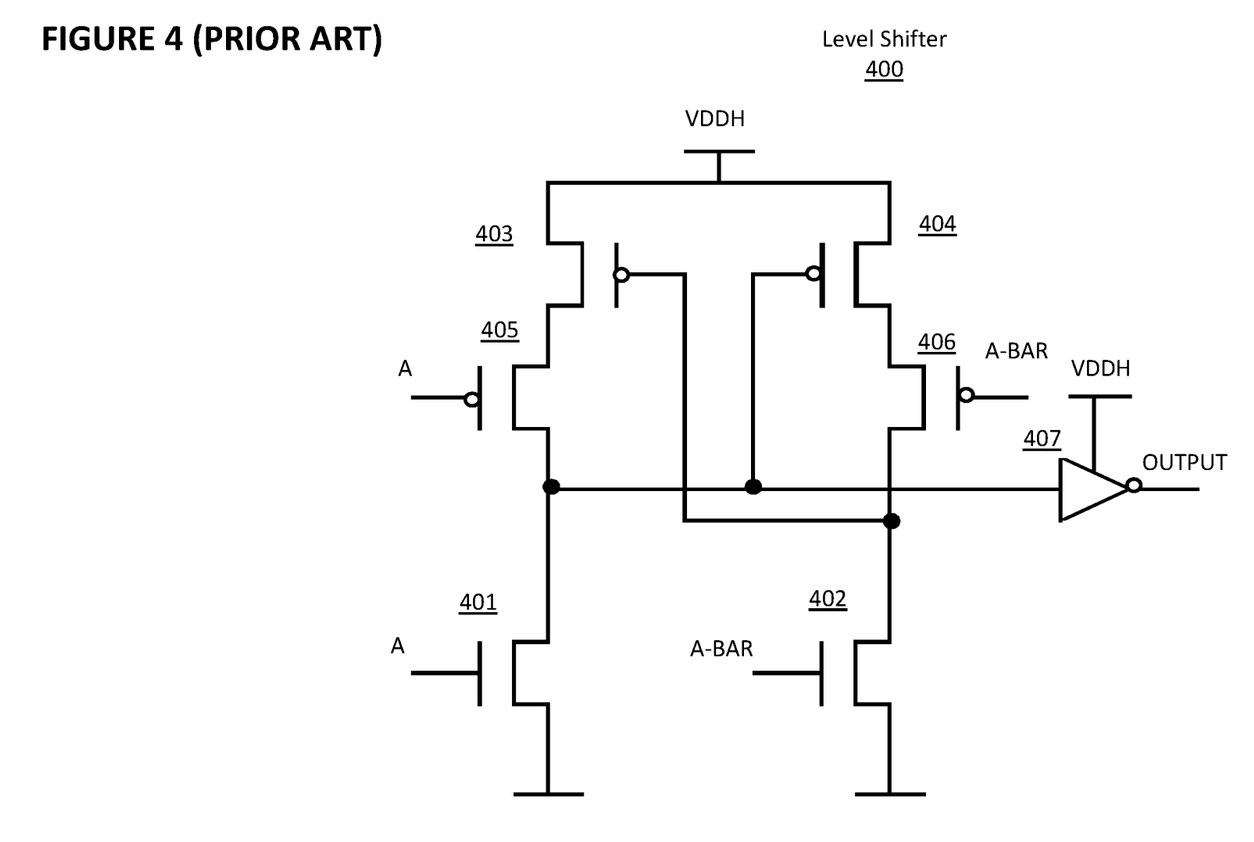
FIG. 4 depicts another prior art level shifter.

FIG. 4 depicts prior art level shifter 400, which is another example of level shifter 100, and which has a shorter switching time than level shifter 300. Level shifter 400 comprises NMOS transistors 401 and 402; PMOS transistors 403, 404, 405, and 406; and inverter 407. Signal A from FIG. 2 is provided to the gate of NMOS transistor 401 and the gate of PMOS transistor 405, and signal A-BAR from FIG. 2 is provided to the gate of NMOS transistor 402 and the gate of PMOS transistor 406.

When A is high, NMOS transistor 401 will be on, transistor 402 will be off, PMOS transistor 405 will be off, and PMOS transistor 406 will be on. The input to inverter 407 will be pulled to ground through NMOS transistor 401, which also will pull down the gate of PMOS transistor 404, thereby turning on PMOS transistor 404, which in turn will cause the gate of PMOS transistor 403 to be pulled high to VDDH through PMOS transistors 404 and 406. The output of inverter 407, labeled OUTPUT, will be high, which here will be a voltage VDDH, which can be, for example, 2.5V.

When A is low, NMOS transistor 401 will be off, NMOS transistor 402 will be on, PMOS transistor 405 will be on, and PMOS transistor 406 will be off. PMOS transistor 403 will be on, since its gate will be pulled to ground through NMOS transistor 402, which will cause the input to inverter 407 to be pulled high to VDDH through PMOS transistors 403 and 405. OUTPUT will then be low.

Although level shifter 400 has a faster switching time than level shifter 300, level shifter 400 is still limited. Specifically, it is unable to decrease the switching time below 1 ns. In addition, level shifter 400 can fail altogether if the peak voltage of A and A-BAR are too low due to low supply voltage VDDL in FIG. 2 being too low.

Applicant recently proposed an improved level shifter in Chinese Patent Application No. 201910733363.9, filed on Aug. 9, 2019, and titled, "Improved Level Shifter for Integrated Circuit." That design will now be described with reference to FIGS. 5-7.

Figure 5:
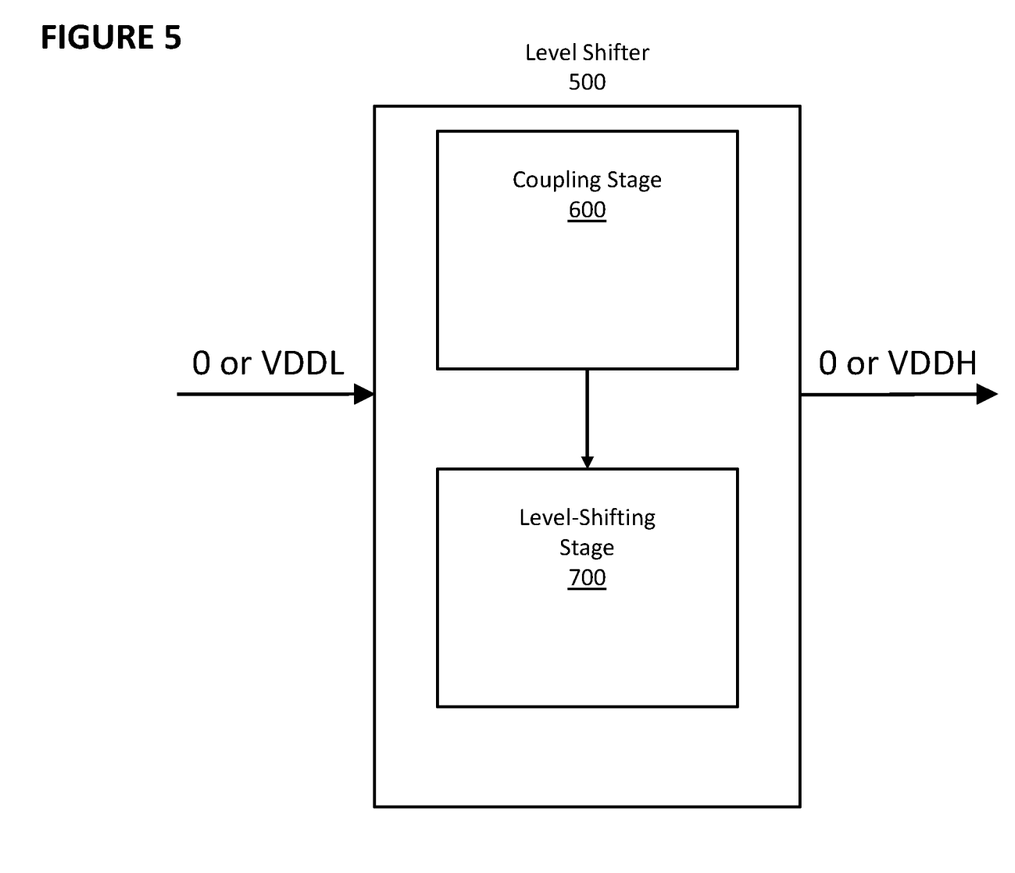
FIG. 5 depicts a level shifter recently proposed by Applicant.

FIG. 5 depicts level shifter 500, which comprises coupling stage 600 and level-shifting stage 700. When level shifter 500 receives a "0" as an input, where "0" is a first voltage, it outputs a "0", i.e. the first voltage, and when it receives a "1" of a first voltage domain (VDDL), which is a second voltage, as an input, and it outputs a "1" of a second voltage domain (VDDH), which is a third voltage different from the first or second voltages.

Figure 6:
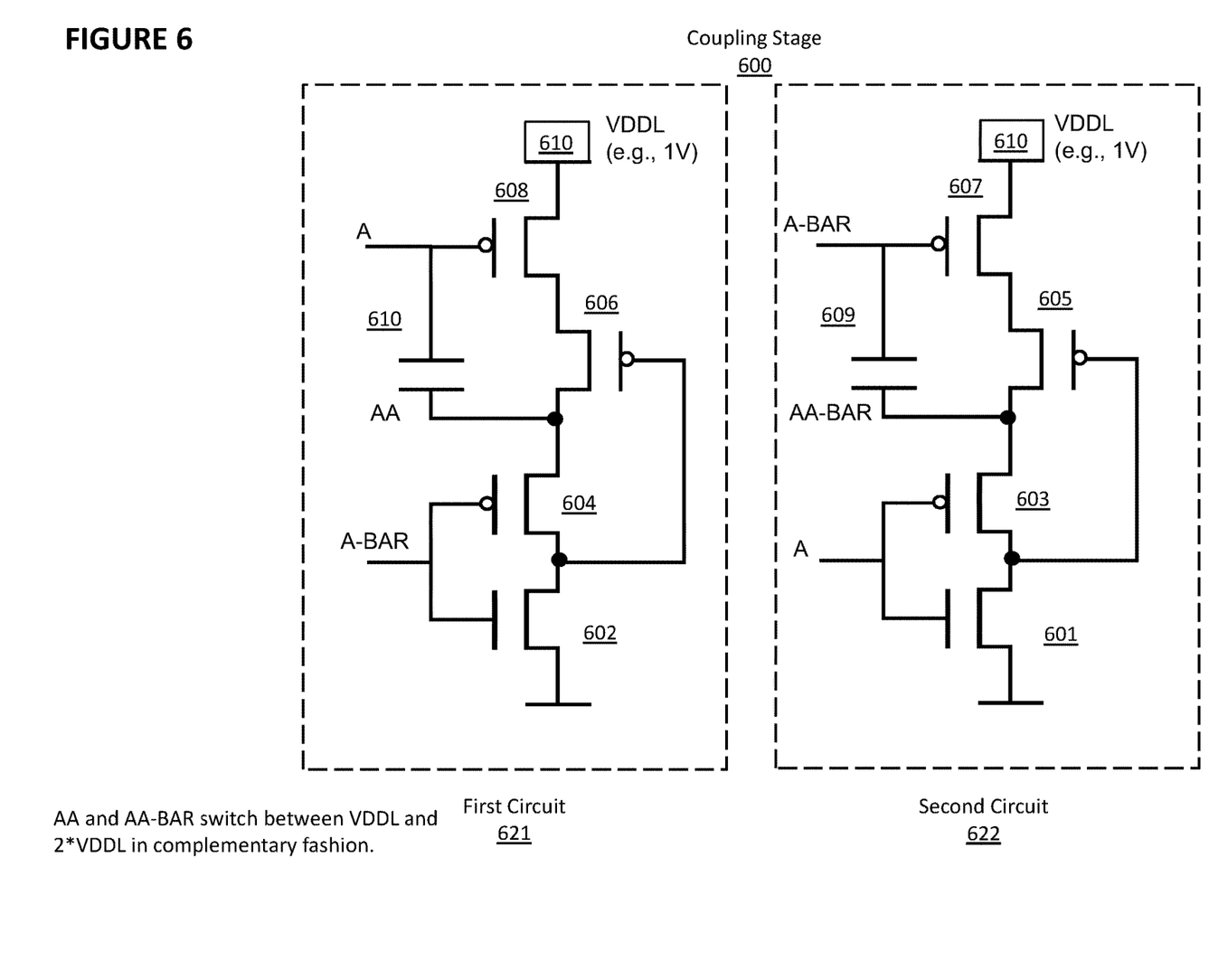
FIG. 6 depicts a coupling stage of the level shifter of FIG. 5.

FIG. 6 depicts coupling stage 600, which comprises first circuit 621 and second circuit 622, both powered by low voltage power source 610, which outputs voltage VDDL. First circuit 621 comprises NMOS transistor 602; PMOS transistors 604, 606, and 608; and capacitor 610. Second circuit 622 comprises NMOS transistor 601; PMOS transistors 603, 605, and 607; and capacitor 609. Signal A from FIG. 2 is provided to the gates of NMOS transistor 601, PMOS transistor 603, and PMOS transistor 608, and signal A-BAR from FIG. 2 is provided to the gates of NMOS transistor 602, PMOS transistor 604, and PMOS transistor 607.

The operation of first circuit 621 will now be described. When A is high, A-BAR is low and NMOS transistor 602 is off, PMOS transistor 604 is on, and PMOS transistor 608 is off. The voltage AA will be floating since both NMOS transistor 602 is off and PMOS transistor 608 is off and will be around 0V in the initial state after start-up, since any vestigial charge on capacitor 610 would have dissipated in the absence of any power source.

When A switches from high to low, A-BAR will switch from low to high, NMOS transistor 602 will turn on, PMOS transistor 604 will turn off, and PMOS transistor 608 will turn on. PMOS transistor 606 also will turn on since its gate will be pulled to ground through NMOS transistor 602. Capacitor 610 will begin charging and the node labeled AA will approach the voltage VDDL since PMOS transistors 606 and 608 are be on, and thus node AA is coupled to the power source providing VDDL through the series connection of PMOS transistors 606 and 608. The above has been described as having a source of NMOS transistor 602 being connected to ground, however this is not meant to be limiting in any way, and any return voltage in relation to VDDH may be utilized in place of ground, throughout this document, without exceeding the scope. The first voltage, i.e. a "0" in the second voltage domain, is a voltage approaching the return voltage.

When A then switches from low to high, A-BAR will switch from high to low. NMOS transistor 602 will be turned off, PMOS transistor 604 will be turned on, and PMOS transistor 608 will be turned off since A is provided to the gate of PMOS transistor 608. The gate of PMOS transistor 606 will be at the voltage of node AA (which will start at VDDL) and will be off. Because A is driving the top plate of capacitor 610 from low to high (which is VDDL), node AA will be driven to 2*VDDL by capacitor 610.

When A then switches from high to low, PMOS transistor 608 will turn on, NMOS transistor 602 will turn on, pulling the gate of PMOS transistor 606 to ground and turning on PMOS transistor 606, which will pull node AA to voltage VDDL. Thus node AA swings from VDDL to 2*VDDL responsive to A switching from low to high, and node AA swings from 2*VDDL to VDDL responsive to A switching from high to low.

The operation of second circuit 622 will now be described. When A is low, A-BAR will be high, NMOS transistor 601 is off, PMOS transistor 603 is on, and PMOS transistor 607 is off. The voltage AA-BAR will be floating since both NMOS transistor 601 and PMOS transistor 607 are off and will be around 0V in the initial state after start-up, since any vestigial charge on capacitor 609 would have dissipated in the absence of any power source.

When A switches from low to high, A-BAR will switch from high to low, NMOS transistor 601 will turn on, PMOS transistor 603 will turn off, and PMOS transistor 607 will turn on. PMOS transistor 605 also will turn on since its gate will be pulled to ground through NMOS transistor 601. The bottom plate of capacitor 609 will be pulled to VDDL through PMOS transistors 607 and 605, and the node labeled AA-BAR will obtain a voltage VDDL.

When A then switches from high to low, A-BAR will switch from low to high, NMOS transistor 601 will be turned off, PMOS transistor 603 will be turned on, and PMOS transistor 607 will be turned off. The gate of PMOS transistor 605 will be at the voltage AA-BAR (which will start at VDDL) through PMOS transistor 603 and will therefore be off. Because A-BAR is driving the top plate of capacitor 609 from low to high (which is VDDL), AA-BAR will be driven to 2*VDDL by capacitor 609.

When A then switches from low to high, A-BAR will switch from high to low, PMOS transistor 607 will turn on and NMOS transistor 601 will turn on, pulling the gate of PMOS transistor 605 to ground and turning on PMOS transistor 605, which will pull node AA-BAR to voltage VDDL through PMOS transistors 605 and 607. Thus node AA-BAR swings from VDDL to 2*VDDL responsive to A-BAR switching from low to high, and node AA-BAR swings from 2*VDDL to VDDL responsive to A-BAR switching from high to low.

Figure 7:
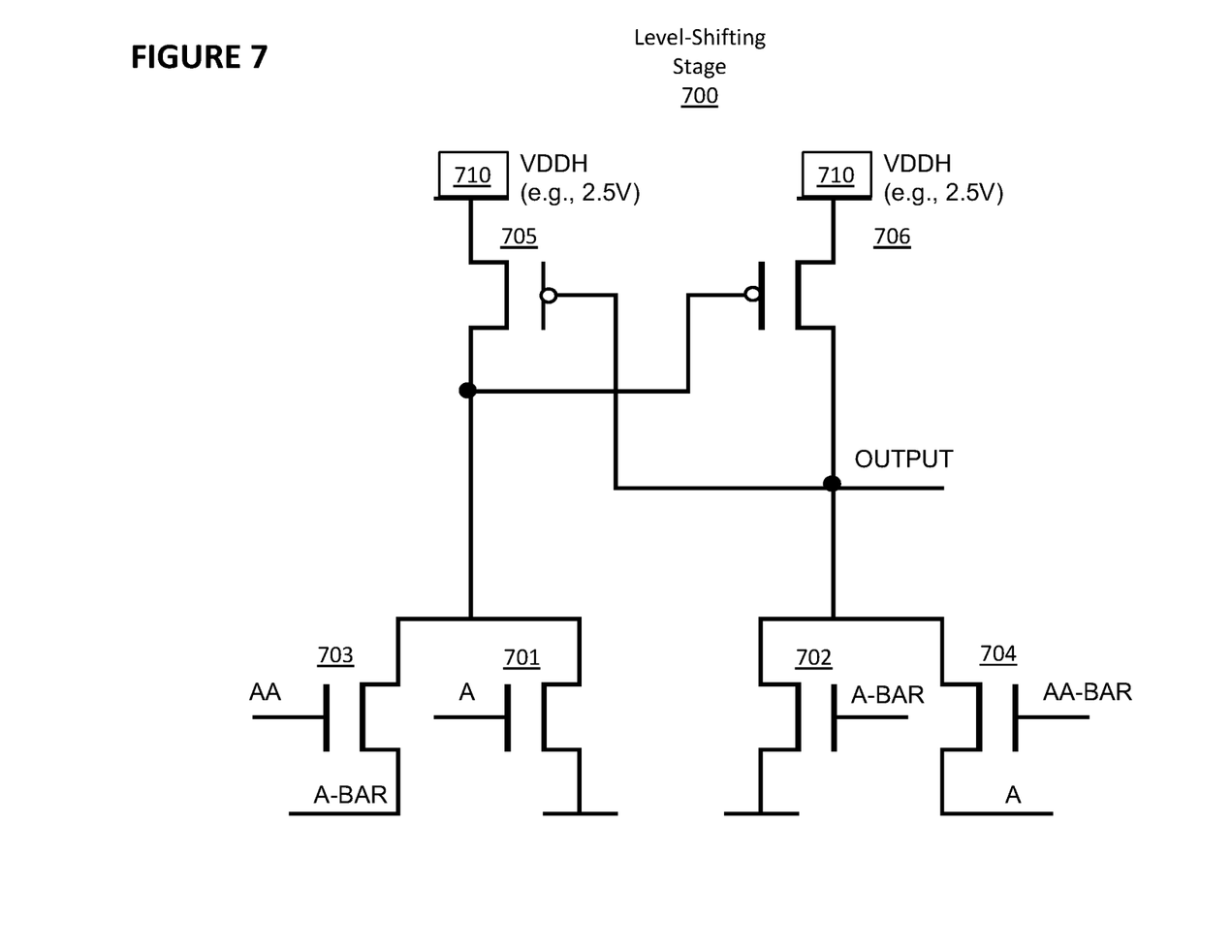
FIG. 7 depicts a level shifting circuit of the level shifter of FIG. 5.

FIG. 7 depicts level-shifting stage 700, which comprises NMOS transistors 701, 702, 703, and 704, PMOS transistors 705 and 706, and high power source 710, which outputs voltage VDDH. Signal A from FIG. 2 is provided to the gate of NMOS transistor 701 and one terminal of NMOS transistor 704. Signal A-BAR from FIG. 2 is provided to the gate of NMOS transistor 702 and one terminal of NMOS transistor 703. Node AA from FIG. 5 is provided to the gate of NMOS transistor 703, and node AA-BAR from FIG. 5 is provided to the gate of NMOS transistor 704. As indicated above, node AA will oscillate between VDDL and 2*VDDL, and node AA-BAR will oscillate between 2*VDDL and VDDL.

When A switches from 1 (VDDL) to 0, A-BAR will switch from 0 to 1 (VDDL), AA will be VDDL, and AA-BAR will be 2*VDDL. NMOS transistor 701 will be off, NMOS transistor 702 will be on, NMOS transistor 703 will be off (since AA and A-BAR will both be VDDL), and NMOS transistor 704 will be on. This will pull node OUTPUT to ground through transistors 702 and 704, and turn on PMOS transistor 705, which will ensure that PMOS transistor 706 is off.

When A switches from 0 to 1 (VDDL), A-BAR will switch from 1 to 0, AA will be 2*VDDL, and AA-BAR will be VDDL. NMOS transistor 701 will be on, NMOS transistor 702 will be off, NMOS transistor 703 will be on, and NMOS transistor 704 will be off (since A and AA-BAR will both be VDDL), and NMOS transistor 704 will be off. The gate of PMOS transistor 706 will be pulled to ground through NMOS transistors 701 and 703, which will turn on PMOS transistor 706 and cause OUTPUT to be pulled to VDDH, thus turning off PMOS transistor 705.

Notably, when A switches from 1 to 0, NMOS transistors 702 and 704 are able to pull the node OUTPUT to ground faster than level shifters 300 and 400 because NMOS transistor 704's overdriving voltage is two times higher. Specifically, the Vgs of pull-down NMOS transistor 704 is 2*VDDL while the Vgs of NMOS transistor 302 and the Vgs of NMOS transistor 402 in level shifter 400 is only VDDL. As a result, OUTPUT in level shifter 700 can be pulled to '0' faster than in level shifter 400.

Similarly, when A switches from 0 to 1, NMOS transistors 701 and 703 are able to pull the gate of PMOS transistor 706 to ground faster than level shifters 300 and 400 because NMOS transistor 703's overdriving voltage is two times higher. As a result, OUTPUT is pulled to VDDH in a very short time. Specifically, the Vgs of pull-down NMOS transistor 703 is 2*VDDL while the Vgs of NMOS transistor 301 in level shifter 300 and the Vgs of NMOS transistor 401 in level shifter 400 each is only VDDL. As a result, the gate of PMOS transistor 706 will be pulled down to '0' quickly and OUTPUT will be pulled up to VDDH faster than in level shifters 300 and 400.

That is, level shifter 500 is able to switch faster than level shifters 300 and 400, meaning that the required switching time for level shifter 500 is smaller than the required switching times for level shifters 300 and 400.

Applicant has performed experiments to compare the shifting speed of level shifter 500 against prior art level shifters 300 and 400. For the conditions VDDL=0.94 to 1.26 V, VDDH=1.4 to 2.75 V, and temperature=−40 degrees C. to 160 degrees C., level shifter 500 was 3.5× faster when A switches from 0 to 1, and 5.7× faster when A switches from 1 to 0. Thus, level shifter 500 is at least 3.5× faster in its switching time than level shifters 300 and 400.

However, even the improved design of FIGS. 5-7 has some drawbacks. Specifically, the design does not work well in a system where the available supply voltages are 0.8 V or lower, because level-shifting stage 700 requires transistors that use a 2.5 V supply voltage. That is, level shifter 500 does not work well if VDDL is relatively small, such as 0.75V.

In addition, the design of FIGS. 5-7 is relatively complex and requires a relatively significant amount of space within the semiconductor die. For example, NMOS transistors 701 and 702 are present in order to maintain functionality during standby mode.

What is needed is an improved level shifting design that is able to decrease its switching time below 0.5 ns while using VDDL as low as 0.75V.

SUMMARY OF THE INVENTION

An improved level shifter is disclosed. The level shifter is able to achieve a switching time below 1 ns while still using a relatively low voltage for VDDL, such as 0.75V-1.26V. The improved level shifter comprises a coupling stage and a level-switching stage.

DETAILED DESCRIPTION OF THE INVENTION

Figure 8:
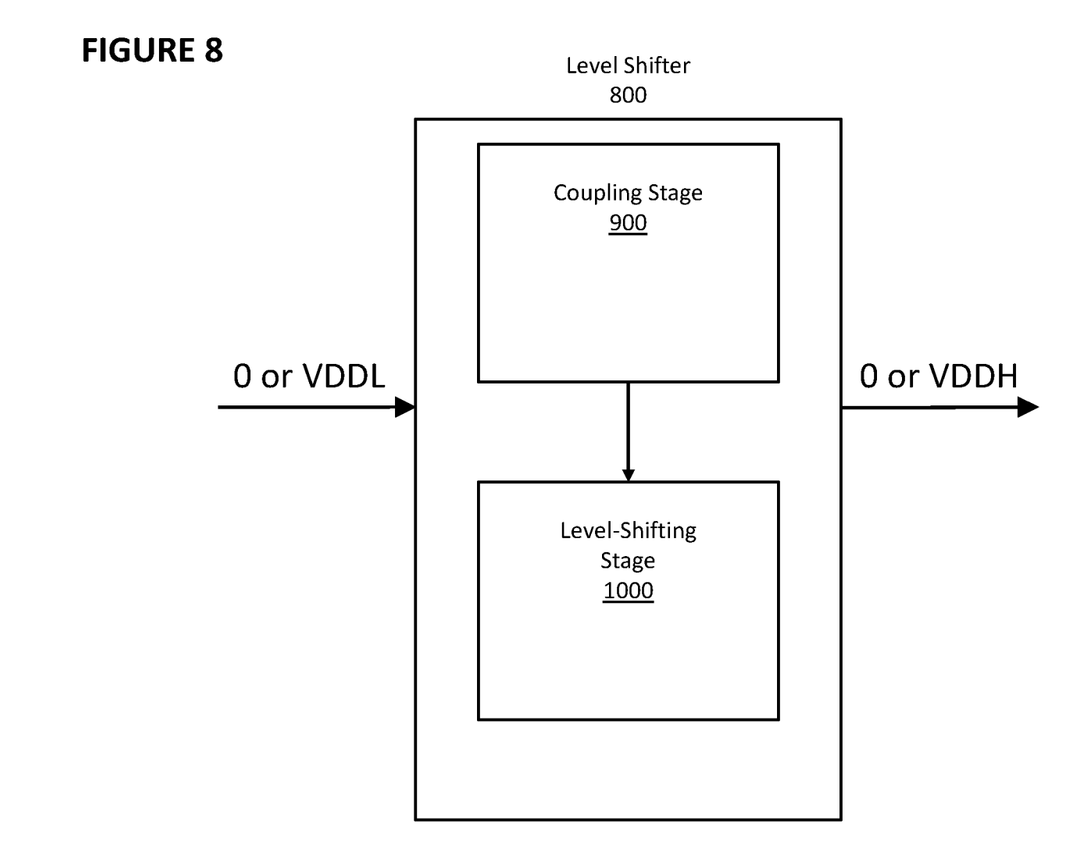
FIG. 8 depicts an improved level shifter.

FIG. 8 depicts level shifter 800, which comprises coupling stage 900 and level-shifting stage 1000. When level shifter 800 receives a "0" as an input, where "0" is a first voltage, it outputs a "0", i.e. the first voltage, and when it receives a "1" of a first voltage domain (VDDL), which is a second voltage, as an input, and it outputs a "1" of a second voltage domain (VDDH, ranging between 1.4V and 2.75V), which is a third voltage different from the first or second voltages.

Figure 9:
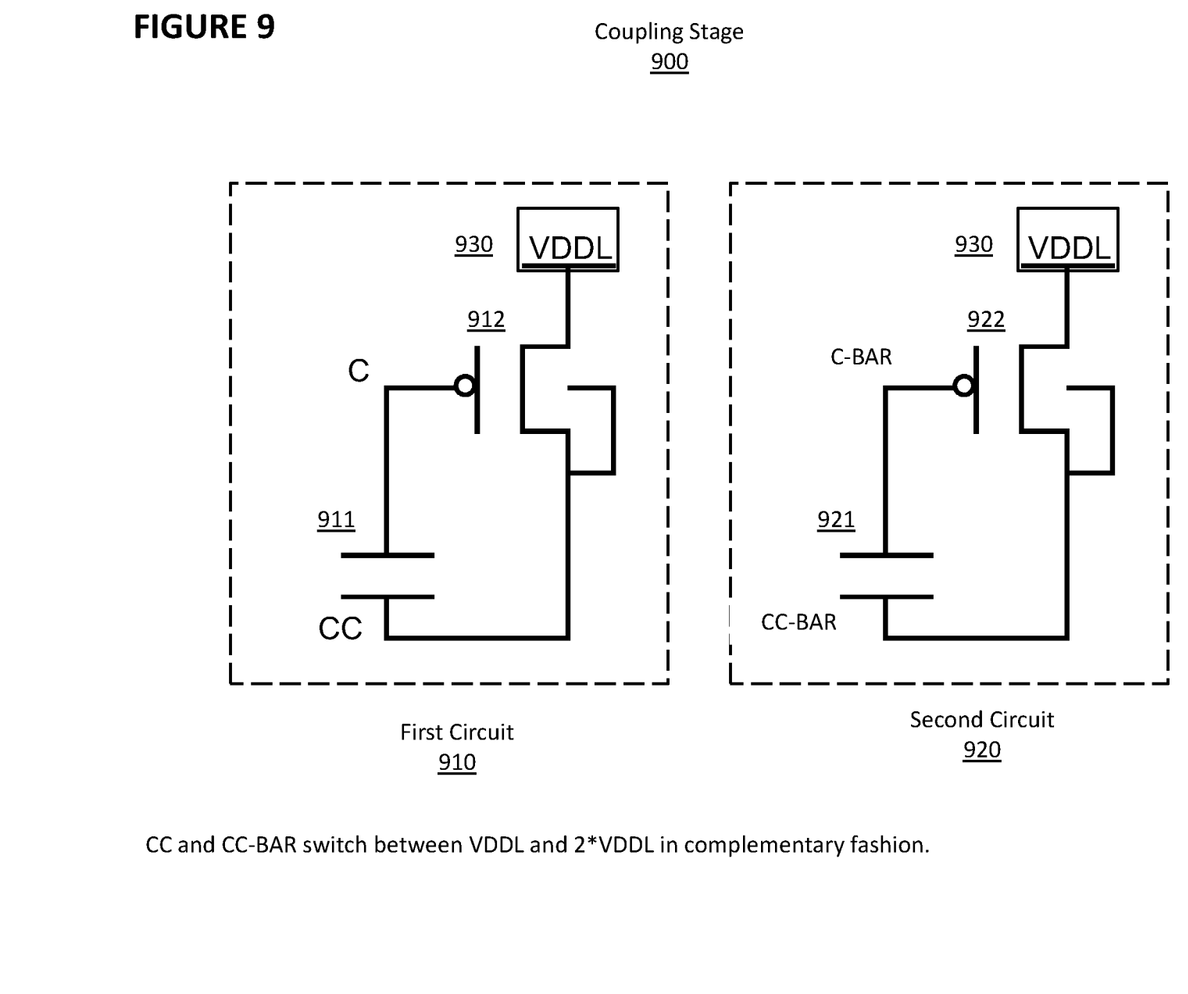
FIG. 9 depicts a coupling stage of the improved level shifter of FIG. 8.

FIG. 9 depicts coupling stage 900, which comprises first circuit 910 and second circuit 920, both powered by low voltage power source 930 (VDDL), whose range is between 0.75V and around 1.26V. First circuit 910 comprises PMOS transistor 912 and capacitor 911. Second circuit 920 comprises PMOS transistor 922 and capacitor 921. The gate of PMOS transistor 912 is connected to a first terminal of capacitor 911, the drain of PMOS transistor 912 is connected to low voltage power source 930 and the source of PMOS transistor 912 is connected to the bulk of PMOS transistor 912 and to a second terminal of capacitor 911, denoted node CC. The gate of PMOS transistor 922 is connected to a first terminal of capacitor 921, the drain of PMOS transistor 922 is connected to low voltage power source 930, and the source of PMOS transistor 922 is connected to the bulk of PMOS transistor 922 and to a second terminal of capacitor 921, denoted node CC-BAR Signal C and C_BAR here are VDDL power domain voltages and are provided respectively to the gates of PMOS transistor 912 and 922.

The operation of coupling stage 900 during standby mode will now be described.

When powering up, VDDL rises from low to high (i.e. from 0 to 0.75V~1.26V), C will rise from low to high (VDDL) and C-BAR maintains a low state (0V). Node CC will rise from low to high (VDDL-VD) coupled through capacitor 911, where VD is the forward voltage from the parasitic diode in PMOS transistor 912. Because there is no current through PMOS transistor 912, VD will be very small (~20 mV). Signal C-BAR maintains a low state and PMOS transistor 922 turns on, so the voltage at node CC-BAR will rise from low to high (VDDL). Thus, capacitor 911 is mostly discharged and has a small voltage across it (VD) and capacitor 921 is charged with a voltage of VDDL across it.

Next, the operation of coupling stage 900 during active mode will be described.

When C switches from high to low, the change in signal C will be coupled through capacitor 911 so that node CC switches from high (VDDL-VD) to low (~0V) immediately and then rise to high (VDDL) because PMOS transistor 912 turns on. C-BAR switches from low to high, and the change in signal C-BAR will be coupled through capacitor 921 so that node CC-BAR switches from high (VDDL) to higher (~2*VDDL) immediately and then falls to VDDL+Vth922 as capacitor 921 discharges through PMOS transistor 922 until the voltage on the source of PMOS transistor 922 falls to the threshold value of PMOS transistor 922 turning it off. Vth922 is the threshold voltage of PMOS transistor 922.

When C switches from low to high, the change in signal C will be coupled through capacitor 911 so that node CC switches from high (VDDL) to higher (~2*VDDL) immediately and then fall to high (VDDL+Vth912) as capacitor 911 discharges through PMOS transistor 912 until the voltage on the source of PMOS transistor 912 falls to the threshold value of PMOS transistor 912 turning it off. Vth912 is the threshold voltage of PMOS transistor 912. C-BAR will switch from high to low, and the change in signal C-BAR will be coupled through capacitor 921 so that node CC-BAR switches from high (VDDL+Vth922) to low (Vth922) immediately and then rise to VDDL, because PMOS transistor 922 turns on at this moment.

Figure 10:
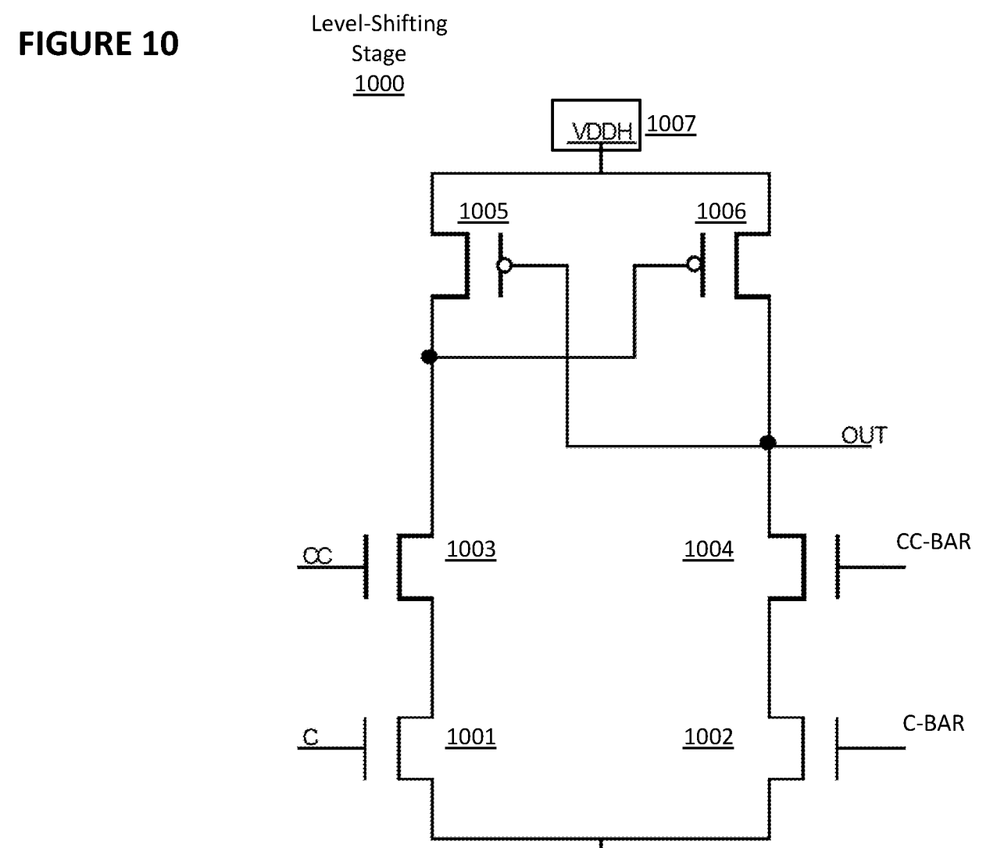
FIG. 10 depicts a level shifting circuit of the improved level shifter of FIG. 8.

FIG. 10 depicts level-shifting stage 1000, which comprises NMOS transistors 1001, 1002, 1003, and 1004, PMOS transistors 1005 and 1006, and high power source 1007, which outputs voltage VDDH. Unlike level shifting stage 700 in level shifter 500, level shifting stage 1000 is able to operate when VDDL is as low as 0.75 V. Signal C is provided to the gate of NMOS transistor 1001. Signal C-BAR is provided to the gate of NMOS transistor 1002. Node CC from FIG. 9 is provided to the gate of NMOS transistor 1003, and node CC-BAR from FIG. 9 is provided to the gate of NMOS transistor 1004.

When C switches from high (VDDL) to low, C-BAR will switch from low to high (VDDL) NMOS transistor 1001 will be off, NMOS transistor 1002 will be on, NMOS transistor 1003 will be on, and NMOS transistor 1004 will be on. The node OUT will be pulled to ground through transistors 1004 and 1002, thus turning PMOS transistor 1005 on. The gate of PMOS transistor 1006 then will be pulled high through PMOS transistor 1005, and PMOS transistor 1006 will be off.

When C switches from low to high (VDDL), C-BAR will switch from high to low. NMOS transistor 1001 will be on, NMOS transistor 1002 will be off, NMOS transistor 1003 will be on, and NMOS transistor 1004 will be on. The gate of PMOS transistor 1006 will be pulled to ground through NMOS transistors 1003 and 1001, which will turn on PMOS transistor 1006 and cause OUTPUT to be pulled to VDDH, thus turning PMOS transistor 1005 off.

Notably, when C switches from high to low, NMOS transistors 1002 and 1004 are able to pull the node OUTPUT to ground faster than prior art level shifters 300 and 400 because NMOS transistor 1004's overdriving voltage (CC-BAR) is two times higher (i.e., 2*VDDL). Specifically, the Vgs of pull-down NMOS transistor 1004 is 2*VDDL while the Vgs of NMOS transistor 302 and the Vgs of NMOS transistor 402 in level shifter 400 is only VDDL. As a result, OUTPUT in level shifting stage 1000 can be pulled to '0' faster than in level shifter 400.

Similarly, when C switches from low to high, NMOS transistors 1003 and 1001 are able to pull the gate of PMOS transistor 1006 to ground faster than level shifters 300 and 400 because NMOS transistor 1003's overdriving voltage (CC) is two times higher (i.e., 2*VDDL). As a result, OUT is pulled to VDDH in a very short time. Specifically, the Vgs of pull-down NMOS transistor 1003 is 2*VDDL while the Vgs of NMOS transistor 301 in level shifter 300 and the Vgs of NMOS transistor 401 in level shifter 400 each is only VDDL. As a result, OUT will be pulled down to ground and up to VDDH faster than in level shifters 300 and 400.

That is, level shifter 800 is able to switch faster than level shifters 300 and 400, meaning that the required switching time for level shifter 800 is smaller than the required switching times for level shifters 300 and 400. In addition, level shifter 800 is able to operate with VDDL as low as 0.75 V.

Figure 11:
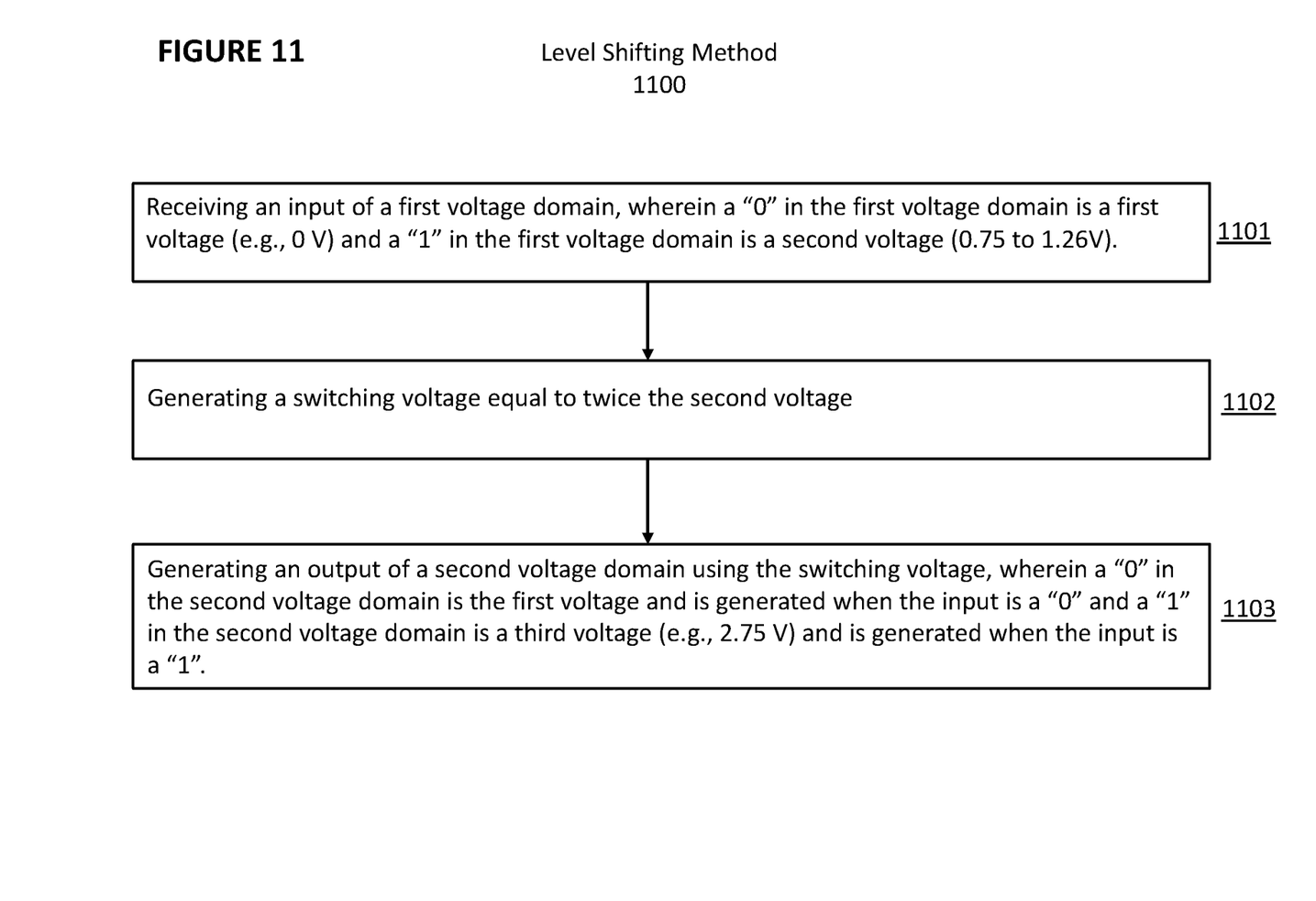
FIG. 11 depicts a method of performing level shifting.

FIG. 11 depicts level shifting method 1100, which can be implemented using level shifter 800. The first step is receiving an input of a first voltage domain, wherein a "0" in the first voltage domain is a first voltage (e.g., 0 V) and a "1" in the first voltage domain is a second voltage (e.g. as low as 0.75 V, preferably 0.75V to 1.26V) (step 1101). The second step is generating a switching voltage equal to twice the second voltage (step 1102). The third step is generating an output of a second voltage domain using the switching voltage, wherein a "0" in the second voltage domain is the first voltage and is generated when the input is a "0" and a "1" in the second voltage domain is a third voltage (e.g., 2.75 V) and is generated when the input is a "1" (step 1103).

Applicant has performed experiments to compare the shifting speed of level shifter 800 against prior art level shifters 300 and 400. For the conditions VDDL=0.75 to 1.26 V, VDDH=1.4 to 2.75 V, and temperature=−40 degrees C. to 160 degrees C., level shifter 800 was 3× faster when A (which is re-labeled as C) switches from 0 to 1, and 5× faster when A (which is re-labeled as C) switches from 1 to 0. Thus, level shifter 800 is at least 3× faster in its switching time than level shifters 300 and 400.

Level shifter 800 is not as fast as level shifter 500 when VDDL is greater than 0.87 V. However, level shifter 800 requires significantly less space on the semiconductor die than level shifter 500 and has a simpler design. In addition, level shifter 800 performs better than level shifter 500 when VDDL is as low as 0.75V.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A level shifter for receiving an input of a first voltage domain and generating an output of a second voltage domain, wherein a "0" in the first voltage domain is a first voltage and a "1" in the first voltage domain is a second voltage and a "0" in the second voltage domain is the first voltage and a "1" in the second voltage domain is a third voltage different than the second voltage, the level shifter comprising:

a first power source providing the third voltage;

a first PMOS transistor comprising a first terminal coupled to the first power source, a gate, and a second terminal;

a second PMOS transistor comprising a first terminal coupled to the first power source, a gate coupled to the second terminal of the first PMOS transistor, and a second terminal coupled to the gate of the first PMOS transistor and to an output node for providing the output;

a first NMOS transistor comprising a first terminal coupled to the second terminal of the first PMOS transistor, a gate configured to receive a first signal; and a second terminal;

a second NMOS transistor comprising a first terminal coupled to the second terminal of the first NMOS transistor, a gate configured to receive the input, and a second terminal coupled to the first voltage;

a third NMOS transistor comprising a first terminal coupled to the output node, a gate coupled to receive a second signal, and a second terminal; and a fourth NMOS transistor comprising a first terminal coupled to the second terminal of the third NMOS transistor, a gate configured to receive a complement of the input, and a second terminal coupled to the first voltage;

wherein the first signal is twice the second voltage when the input is at the second voltage and is the second voltage when the input is at the first voltage;

wherein the second signal is twice the second voltage when the input is at the first voltage and is the second voltage when the input is at the second voltage; and wherein when the input is the first voltage, the output is the first voltage, and when the input is the second voltage, the output is the third voltage.

2. The level shifter of claim 1, further comprising a second power source providing the second voltage.

3. The level shifter of claim 2, wherein the first signal is generated by a first circuit comprising:
- a third PMOS transistor comprising a first terminal coupled to the second power source, a gate, a second terminal, and a bulk; and
- a first capacitor comprising a first terminal coupled to the gate of the third PMOS transistor and a second terminal coupled to the second terminal of the third PMOS transistor and the bulk of the third PMOS transistor.

4. The level shifter of claim 3, wherein the second signal is generated by a second circuit comprising:
- a fourth PMOS transistor comprising a first terminal coupled to the second power source, a gate, a second terminal, and a bulk; and
- a second capacitor comprising a first terminal coupled to the gate of the fourth PMOS transistor and a second terminal coupled to the second terminal of the fourth PMOS transistor and the bulk of the fourth PMOS transistor.

5. The level shifter of claim 1, wherein the second voltage is between 0.75 volts and 1.26 volts.

6. The level shifter of claim 2, wherein the second voltage is between 0.75 volts and 1.26 volts.

7. The level shifter of claim 3, wherein the second voltage is between 0.75 volts and 1.26 volts.

8. The level shifter of claim 4, wherein the second voltage is between 0.75 volts and 1.26 volts.

* * * * *